(12) United States Patent
Liu

(10) Patent No.: US 7,114,256 B2
(45) Date of Patent: Oct. 3, 2006

(54) COOLING DEVICE AND APPARATUS AND METHOD FOR MAKING THE SAME

(75) Inventor: HeBen Liu, Shenzhen (CN)

(73) Assignees: Fu Zhun Precision Industrial (Shenzhen) Co., Ltd., Shenzhen (CN); Foxconn Technology Co., Ltd., Tu-Cheng (TW)

( * ) Notice: Subject to any disclaimer, the term of this patent is extended or adjusted under 35 U.S.C. 154(b) by 366 days.

(21) Appl. No.: 10/660,306

(22) Filed: Sep. 10, 2003

(65) Prior Publication Data
US 2004/0125525 A1 Jul. 1, 2004

(30) Foreign Application Priority Data
Dec. 27, 2002 (TW) .............................. 91221271 U

(51) Int. Cl.
*B23P 15/26* (2006.01)
(52) U.S. Cl. ........................ 29/890.046; 29/890.032; 29/890.045; 29/890.05; 29/726
(58) Field of Classification Search ........... 29/890.032, 29/890.046, 890.05, 890.045, 726
See application file for complete search history.

(56) References Cited

U.S. PATENT DOCUMENTS 6,410,982 B1 6/2002 Brownell et al.
6,516,867 B1 * 2/2003 Ootori et al. ............... 164/137

* cited by examiner

*Primary Examiner*—David P. Bryant
*Assistant Examiner*—Christopher Agrawal
(74) *Attorney, Agent, or Firm*—Wei Te Chung

(57) ABSTRACT

A cooling device (10) for heat dissipation for a heat-generating component includes a heat sink (14) and a heat pipe (13). The heat sink attached to the component includes a base (11) and a plurality of fins (12) extending from the base. A bottom portion of the heat pipe formed between the base and the fins, the remainder of the heat pipe formed through the fins. An apparatus for making the cooling device includes a mold (20) and a core (30) accommodated in the mold. The mold includes a base part (21) and a pair of symmetrical forming parts (22) slidably engaged on the base part. The forming parts defines a plurality of slots (222), a cavity (224), and a recess (225) respectively corresponding to the fins of the heat sink, the base of the heat sink, and the heat pipe.

20 Claims, 6 Drawing Sheets

COOLING DEVICE AND APPARATUS AND METHOD FOR MAKING THE SAME

BACKGROUND OF THE INVENTION

1. Field of the Invention

The present invention relates generally to cooling devices, and more particularly to a cooling device for heat dissipation for electronic components, and to an apparatus and method for making the cooling device.

2. Related Art

Electronic apparatuses such as computers generate large amounts of heat. In a typical personal computer, this is due to electronic components such as semiconductors having high-density integrated circuits and employing high frequency operational clocks. There is much concern as to how to maintain an electronic component within an operating temperature range that ensures normal operation. High-density integration of circuits in Central Processing Units (CPUs) has dramatically increased in recent years, and clock frequencies of these CPUs have increased commensurately. Heat dissipation is highly important for stable operation and long operating lifetimes.

A cooling device is often attached directly on a CPU for maximum heat dissipation. A conventional cooling device comprises a base, a heat sink having a plurality of fins, and a heat pipe. The base is mounted on the surface of a CPU. The heat sink is attached to the base by welding or gluing. The heat pipe is arranged between the base and the heat sink. One end of the heat pipe is attached to the base by welding or gluing, and the other end of the heat pipe extends through the fins of the heat sink and is attached therein by welding or gluing.

However, the base, heat sink and heat pipe of this cooling device are manufactured separately and then attached together. Three sets of molds are required for manufacturing the three individual components. Thus manufacturing costs of the cooling device are greatly inflated. In addition, the operation of welding or gluing the components together is unduly cumbersome and time consuming. Furthermore, cracks or seams may be formed during welding operations, and glues typically have low heat conductivity. These features can significantly reduce the heat dissipation efficiency of the cooling device.

SUMMARY OF THE INVENTION

Accordingly, an object of the present invention is to provide a cooling device which comprises a heat sink and a heat pipe integrally made.

Another object of the present invention is to provide an apparatus for making a cooling device having a heat sink and a heat pipe integrally made.

A further object of the present invention is to provide a method for making a cooling device having a heat sink and a heat pipe integrally made.

To achieve the above-mentioned objects, a cooling device for heat dissipation for a heat-generating component in accordance with a preferred embodiment of the present invention includes a heat sink and a heat pipe. The heat sink attached to the component includes a base and a plurality of fins extending from the base. The heat pipe is integrally formed with the heat sink. The heat pipe is filled with working liquid. A bottom portion of the heat pipe is formed between the base and the fins, the remainder of the heat pipe is formed through the fins. The base absorbs heat from the component. The bottom portion of the heat pipe absorbs heat from the base and transmits heat to the remainder of the heat pipe by way of flow of the working liquid, whereupon heat is conducted to the fins.

An apparatus for making the cooling device in accordance with a preferred embodiment of the present invention includes a mold and a core accommodated in the mold. The mold includes a base part and a pair of symmetrical forming parts slidably engaged on the base part. The forming parts defines a plurality of slots, a cavity, and a recess respectively corresponding to the fins of the heat sink, the base of the heat sink, and the heat pipe.

A method for making the cooling device in the apparatus in accordance with a preferred embodiment of the present invention includes:
a) attaching the core to one of the forming parts;
b) closing the mold, with the two forming parts being slidingly attached together and abutting each other;
c) feeding molten material into the mold;
d) allowing the molten material to cool;
e) opening the mold, with the two forming parts being slidingly moved apart, and taking out a preform of the cooling device from the mold;
f) removing the core;
g) removing by-products formed as part of the preform;
h) sealing one end of the heat pipe being part of the preform;
i) filling working liquid into the heat pipe via the unsealed end thereof; and sealing the unsealed end of the heat pipe.

Other objects, advantages and novel features of the present invention will be drawn from the following detailed description of preferred embodiments of the present invention with the attached drawings, in which:

DESCRIPTION OF THE PREFERRED EMBODIMENT

Figure 1:
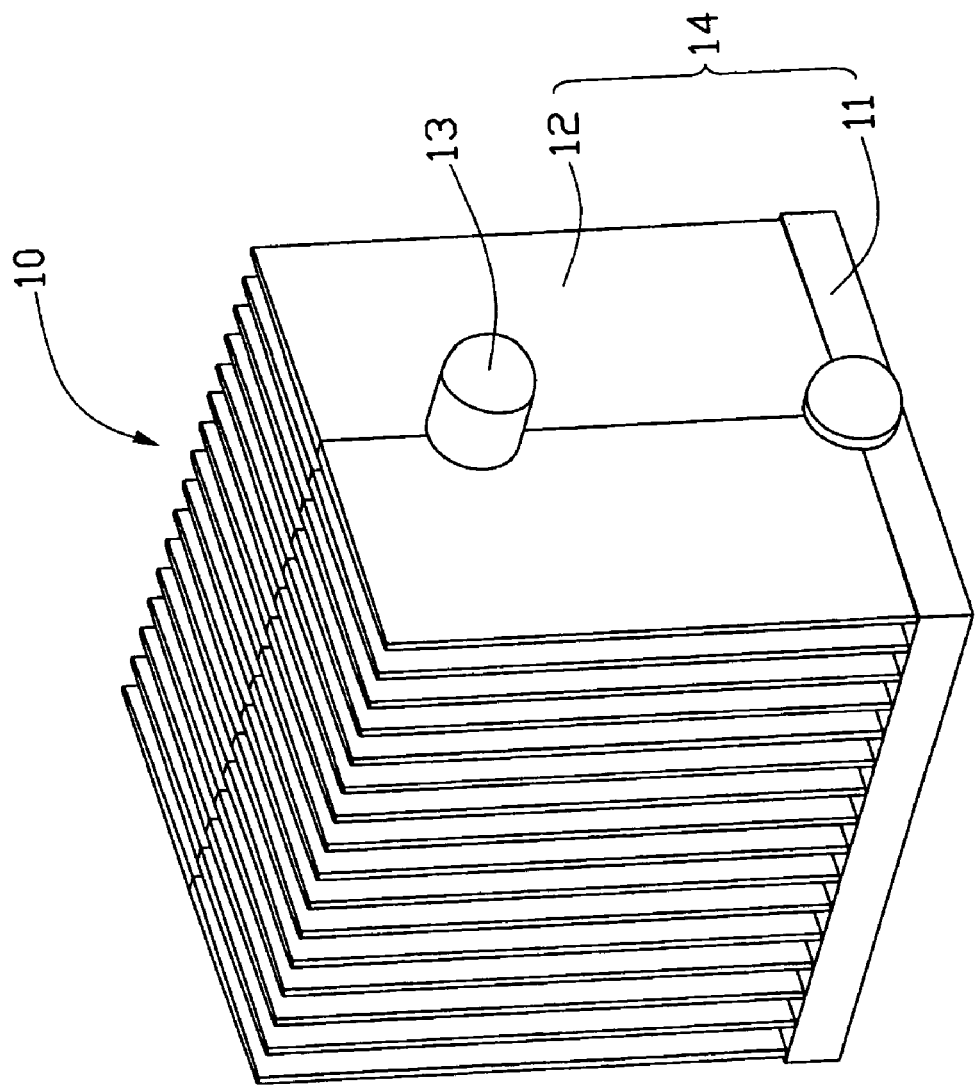
FIG. 1 is an isometric view of a cooling device in accordance with the preferred embodiment of the present invention.

Referring to FIG. 1, a cooling device 10 in accordance with the preferred embodiment of the present invention comprises a heat sink 14, and a heat pipe 13 integrally formed with the heat sink 14.

The heat sink 14 comprises a base 11. The base 11 is for attaching to a heat source such as an electronic component (not shown). A plurality of fins 12 extends upwardly from the base 11 for heat dissipation. The heat pipe 13 is generally U-shaped, and is integrally formed through the base 11 and the fins 12 of the heat sink 14. A bottom portion of the heat pipe 13 is formed between the base 11 and the fins 12, and the remainder of the heat pipe 13 is formed transversely through the fins 12. Two sealed ends of the heat pipe 13 are exposed at one side of the heat sink 14. The heat pipe 13 is filled with capillary material and working liquid. When the base 11 absorbs heat from the electronic component, the bottom portion of the heat pipe 13 absorbs heat from the base 11, and transmits the heat to the remainder of the heat pipe 13 by way of flow of the working liquid, whereupon the heat is conducted to the fins 12.

The cooling device 10 is integrally formed with only a single mold 20 being required. This significantly reduces manufacturing costs. Moreover, the integrated configuration of the heat sink 14 and the heat pipe 13 helps ensure that the cooling device 10 operates dependably and efficiently. The integrated configuration of the cooling device 10 eliminates the drawbacks of conventional cooling devices such as cracks or seams formed during welding operations, or glues that typically have low heat conductivity.

Figure 2:
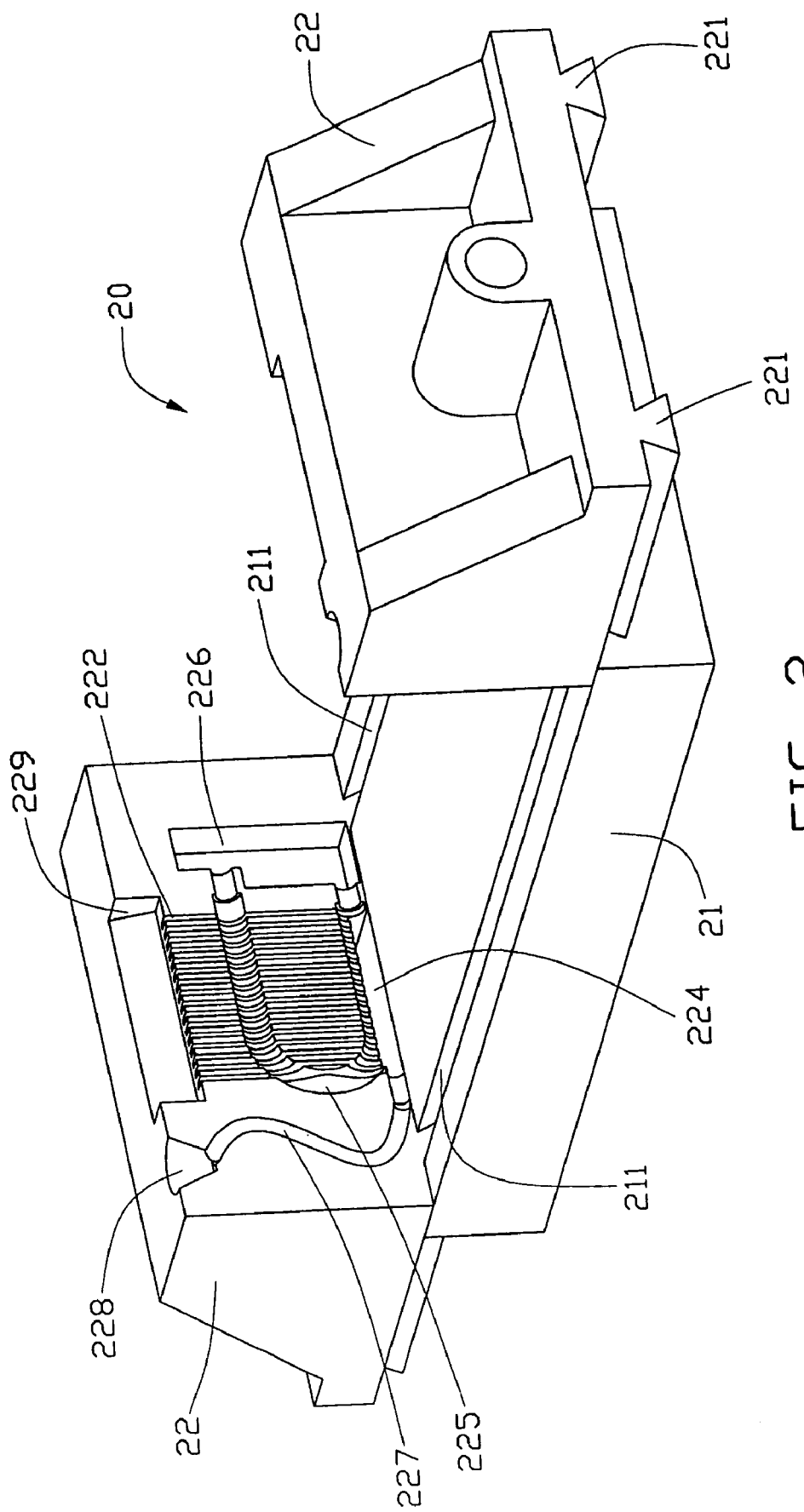
FIG. 2 is an isometric view of an apparatus for making a cooling device in accordance with the preferred embodiment of the present invention.
Figure 3:
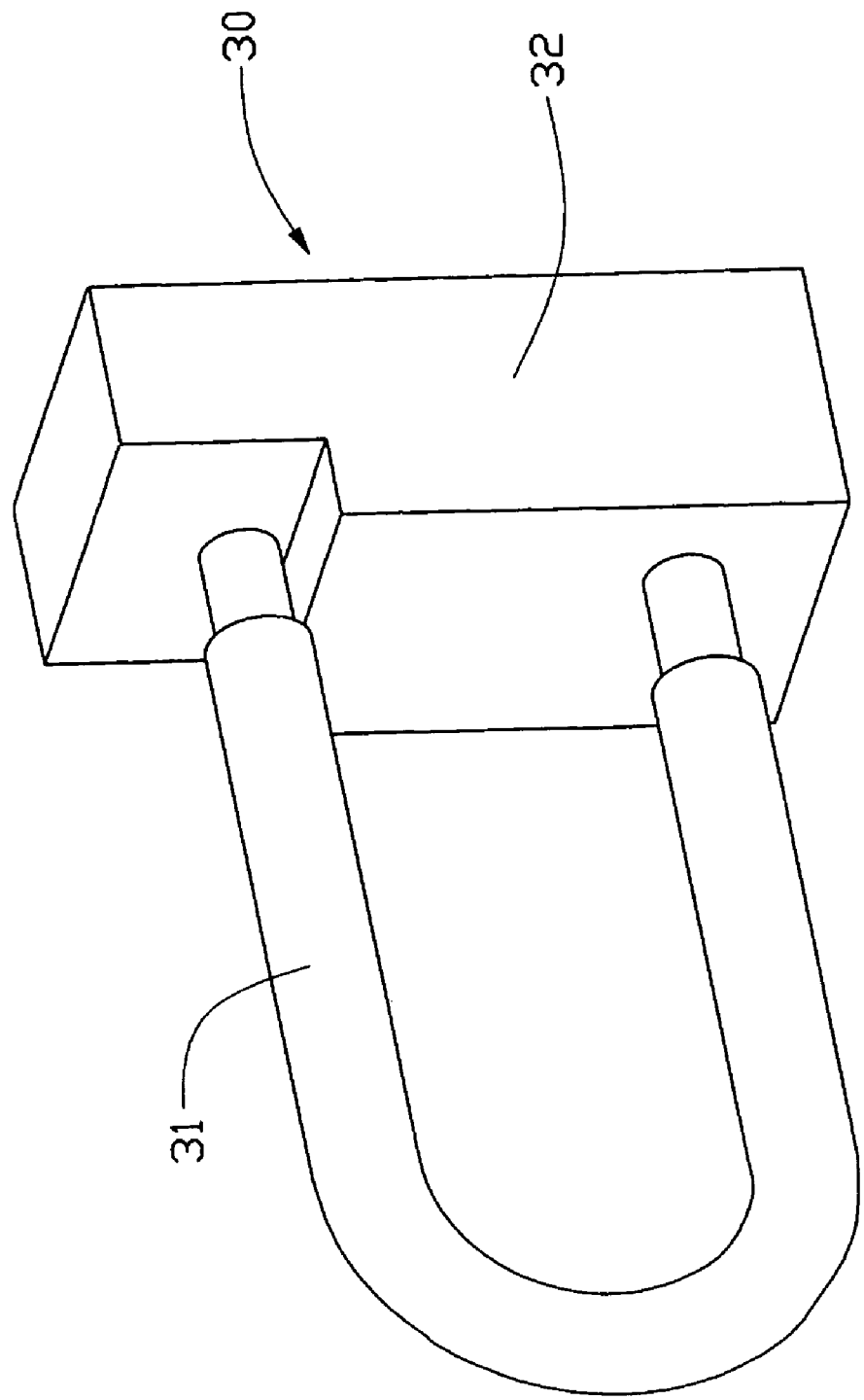
FIG. 3 is an enlarged, isometric view of a core for use with the apparatus of FIG. 2.
Figure 4:
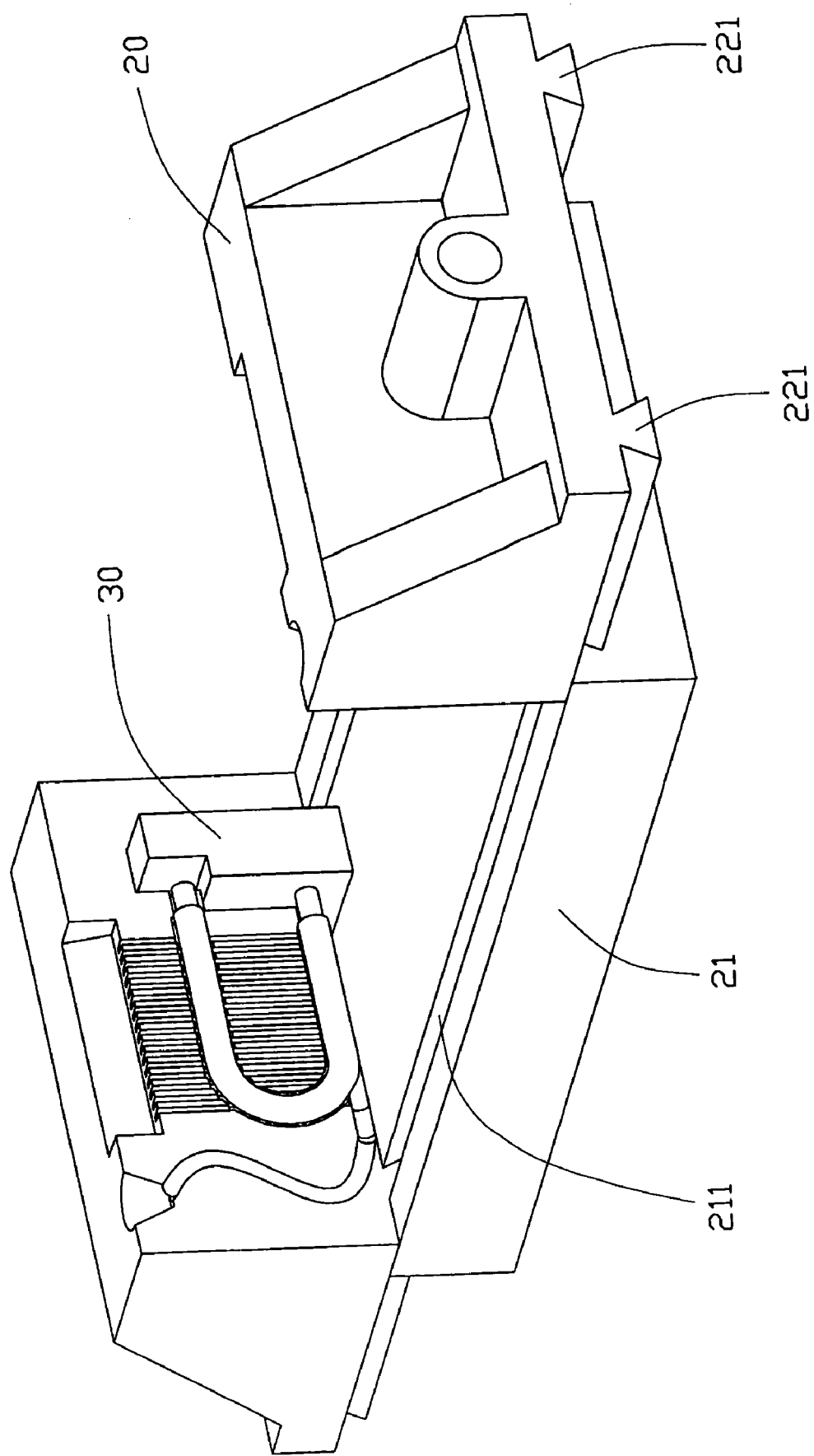
FIG. 4 is similar to FIG. 2, but showing the core of FIG. 3 attached to the apparatus.

Referring to FIGS. 2–4, an apparatus for making the cooling device 10 comprises the mold 20, and a core 30 accommodated in the mold 20.

Referring particularly to FIG. 2, the mold 20 comprises a base part 21, and a pair of forming parts 22 slidably engaged on the base part 21. Because the two forming parts 22 are symmetrically identical, only one of them will be described below. The base part 21 defines a pair of dovetail grooves 211 in a top face (not labeled) thereof. Each forming part 22 comprises a pair of bottom slide blocks 221 slidably engaged in the grooves 211. An inside of the forming part 22 defines a plurality of parallel slots 222, for forming the fins 12 of the cooling device 10. A cavity 224 is defined at a bottom of and in communication with the slots 222, for forming the base 11 of the cooling device 10. A generally U-shaped recess 225 is defined in communication with the slots 222 and the cavity 224, for forming the heat pipe 13 of the cooling device 10. A bottom portion of the recess 225 is located where the cavity 224 adjoins the slots 222, and the remainder of the recess 225 is located transversely adjoining the slots 12. A chamber 226 is defined in the forming part 22 adjacent the slots 222, and in communication with ends of the recess 225. An elongated well 229 is defined above and in communication with the slots 222. The well 229 provides air venting when the mold 20 is filled with molten material, and also provides surplus molten material that is needed when molten material in the slots 222 solidifies and shrinks during the molding process. A sprue 228 is defined adjacent one end of the well 229, for feeding molten material into the mold 20. A conduit 227 is defined under and in communication with the sprue 228. A bottom end of the conduit 227 is in communication with the cavity 224. The conduit 227 conveys molten material from the sprue 228 to the cavity 224.

Referring particularly to FIGS. 3–4, the core 30 comprises a generally U-shaped main body 31, and a peripheral portion 32 integrally adjoining ends of the main body 31. The main body 31 and the peripheral portion 32 are respectively accommodated in the recess 225 and chamber 226, for forming the heat pipe 13 of the cooling device 10. The core 30 can be made of water-soluble material, sand, or metal pipe.

Figure 5:
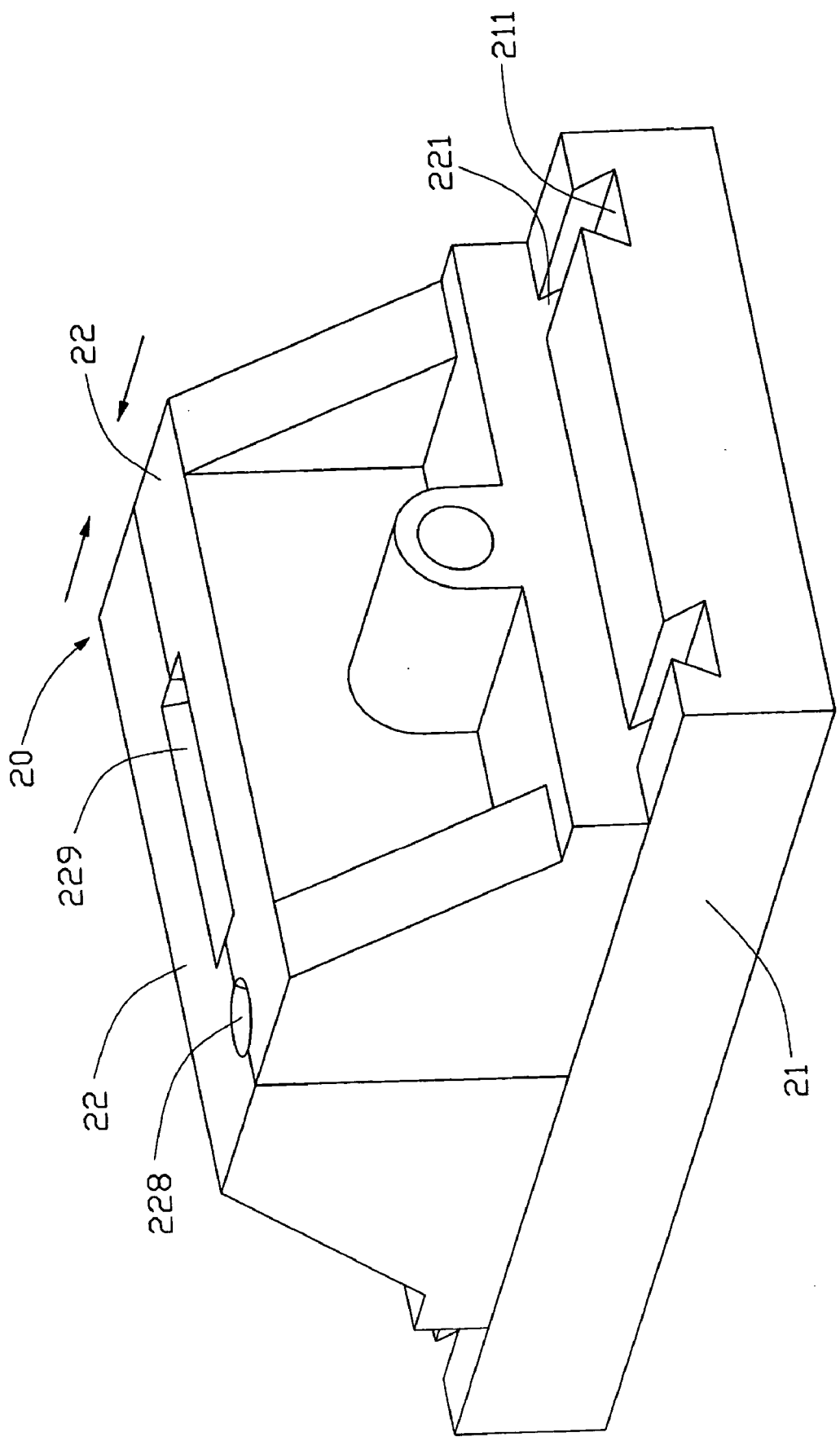
FIG. 5 is similar to FIG. 4, but showing the apparatus in a closed position.
Figure 6:
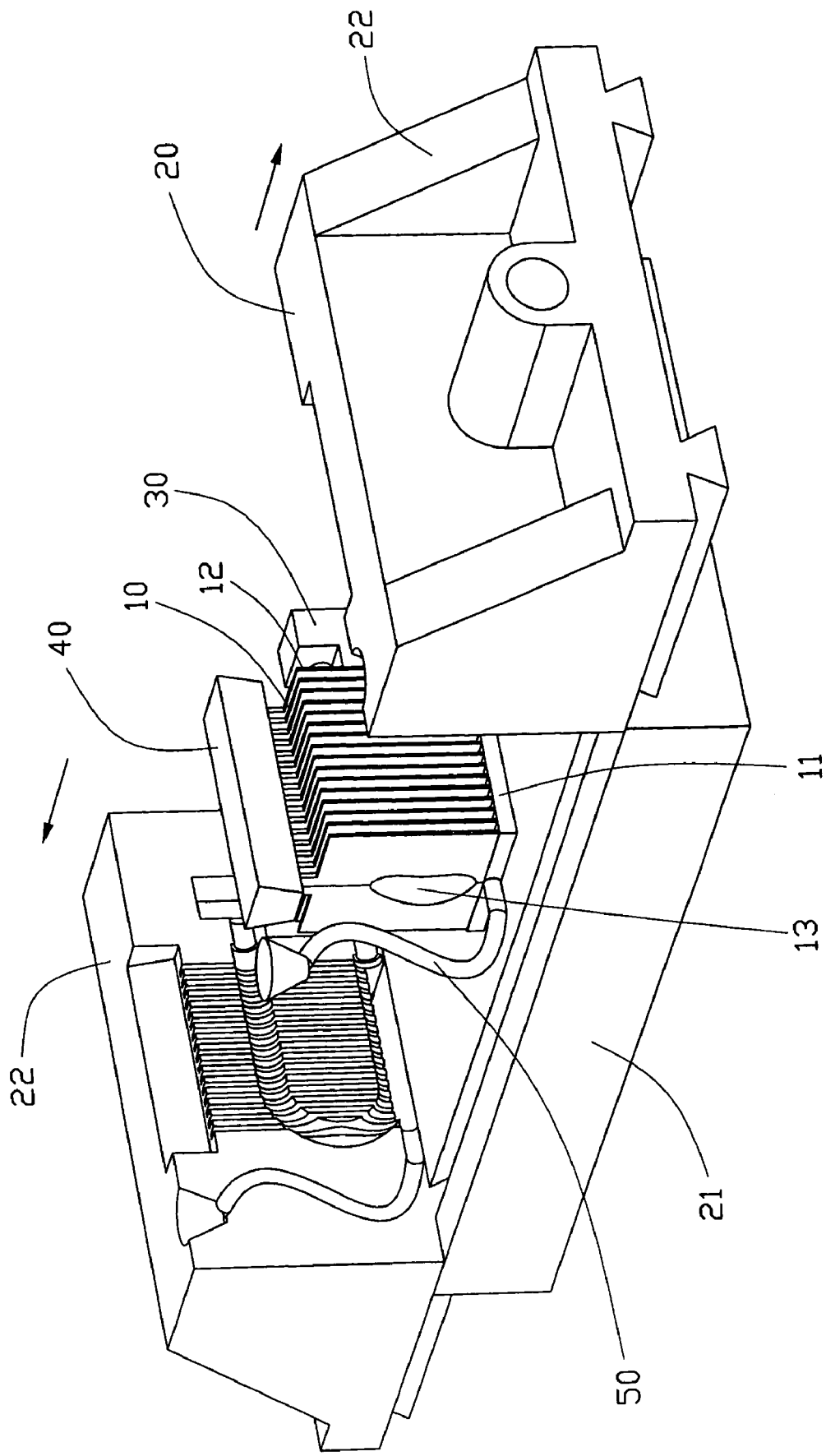
FIG. 6 is similar to FIG. 4, but showing the apparatus in an open position, and showing a cooling device preform formed with the core.

Referring to FIGS. 5–6, a preferred method for making the cooling device 10 comprises the following steps:

a) providing the mold 20, the two forming parts 22 being slidably mounted on opposite sides of the base part 21 by engagement of the slide blocks 221 of the forming parts 22 in the corresponding dovetail grooves 211;

b) providing the core 30;

c) attaching the core 30 to one of the forming parts 22, the main body 31 and the peripheral portion 32 of the core 30 being respectively accommodated in the recess 225 and the chamber 226 of said one of the forming parts 22;

d) closing the mold 20, with the two forming parts 22 being slidingly attached together and abutting each other (see FIG. 5);

e) feeding molten material into the mold 20 via the sprue 228, the molten material passing through the conduit 227 and entering and filling up the cavity 224, the slots 222 and the recess 225;

f) allowing the molten material to cool;

g) opening the mold 20, with the two forming parts 22 being slidingly moved apart, and taking out a preform of the cooling device 10 from the mold 20 (see FIG. 6);

h) removing the core 30 as follows:
  1) if the core 30 is made of water-soluble material, soaking the preform in water to dissolve the core 30, thereby providing the hollow heat pipe 13;
  2) if the core 30 is made of sand, scouring the core 30 with high-pressure water to break the core 30 into pieces and wash the sand away, thereby providing the hollow heat pipe 13; or
  3) if the core 30 is made of metal pipe, cutting the peripheral portion 32 away from the preform, thereby providing the hollow heat pipe 13;

i) removing by-products 40, 50 formed as part of the preform (see FIG. 6);

j) sealing one end of the heat pipe 13 of the preform;

k) filling capillary material into the heat pipe 13 via the other unsealed end thereof;

l) filling working liquid into the heat pipe 13 via the unsealed end thereof; and m) evacuating air from the heat pipe 13, and sealing the unsealed end thereof.

It is understood that the invention may be embodied in other forms without departing from the spirit thereof. Thus, the present examples and embodiments are to be considered in all respects as illustrative and not restrictive, and the invention is not to be limited to the details given herein. For example, the lower arm of the U-shaped heat pipe 13 may be fully embedded in the base 11 instead of halfly embedded disclosed in the present embodiment.

The invention claimed is:

1. An apparatus for making a cooling device, the cooling device comprising a heat sink and a heat pipe integrally formed with the heat sink, the heat sink comprising a base and a plurality of fins, the apparatus comprising:

a mold, comprising a base part and a pair of symmetrical forming parts slidably engaged on the base part, each of the forming parts defining a plurality of slots corresponding to the fins of the heat sink, a cavity at endmost portions of the slots corresponding to the base of the heat sink, and a recess in communication with the cavity corresponding to the heat pipe, wherein one portion of the recess extends transversely the slots; and a core accommodated in the recess of the forming parts.

2. The apparatus as claimed in claim 1, wherein the base part defines a pair of grooves in a top face thereof, and each of the forming parts comprises a pair of slide blocks sudably engaged in the grooves.

3. The apparatus as claimed in claim 1, wherein each of the forming parts further defines a chamber adjacent the slots, and the chamber is in communication with ends of the recess.

4. The apparatus as claimed in claim 3, wherein each of the forming parts further defines a sprue and a conduit connecting between the sprue and the cavity, the sprue being for feeding molten material into the mold, the conduit being for conveying molten material from the sprue to the cavity.

5. The apparatus as claimed in claim 4, wherein each of the forming parts further defines a well above and in communication with the slots, for air venting when the mold is filled with molten material and for providing surplus molten material needed when molten material in the slots solidifies and shrinks during a molding process.

6. The apparatus as claimed in claim 3, wherein the core comprises a generally U-shaped main body and a peripheral portion integrally adjoining ends of the main body, the main body is accommodated in the recesses of the forming parts, and the peripheral portion is accommodated in the chambers of the forming parts.

7. The apparatus as claimed in claim 6, wherein the core is made of water-soluble material.

8. The apparatus as claimed in claim 6, wherein the core is made of sand.

9. The apparatus as claimed in claim 6, wherein the core is made of metal pipe.

10. A method for making a cooling device, the cooling device comprising a heat sink and a heat pipe integrally formed with the heat sink, the heat sink comprising a base and a plurality of fins, the method comprising the steps of:
   a) providing a mold for making the cooling device, the mold comprising a base part and a pair of forming parts slidably engaged on the base part, the forming parts defining a void therebetween corresponding to a configuration of the cooling device;
   b) providing a core corresponding to the heat pipe of the cooling device, the core comprising a main body and a peripheral portion adjoining ends of the main body;
   c) attaching the core to one of the forming parts;
   d) closing the mold, with the two forming parts being slidingly moved toward each other;
   e) feeding molten material into the mold;
   f) allowing the molten material to cool;
   g) opening the mold, with the two forming parts being sildingly moved apart, and taking out a preform of the cooling device from the mold;
   h) removing the core;
   i) removing by-products formed as part of the preform;
   j) sealing one end of the heat pipe being part to the preform;
   k) filling working liquid into the heat pipe via an unsealed end thereof; and
   l) sealing the unsealed end of the heat pipe.

11. The method as claimed in claim 10, further comprising the step of filling capillary material into the heat pipe via the unsealed end thereof before step k).

12. The method as claimed in claim 10, further comprising the step of evacuating air from the heat pipe before step l).

13. The method as claimed in claim 10, wherein the core is made of sand, and step h) comprises soaking the preform in water to dissolve the core and thereby provide the heat pipe.

14. The method as claimed in claim 10, wherein the core is made of sand, and step h) comprises scouring the core with high-pressure water to break the core into pieces and wash the sand away and thereby provide the heat pipe.

15. The method as claimed in claim 10, wherein the core is made of metal pipe, and step h) comprises cutting the peripheral portion away from the preform and thereby provide the heat pipe.

16. An apparatus for making a cooling device, the cooling device comprising a heat sink and a heat pipe integrally formed with the heat sink, the heat sink comprising a base and a plurality of fins, the apparatus comprising:
   a mold, comprising a base part and a pair of symmetrical forming parts slidably engaged on the base part, each of the forming parts defining a plurality of slots corresponding to the fins of the heat sink, a cavity at endmost portions of the slots corresponding to the base of the heat sink, and a recess in communication with the cavity corresponding to the heat pipe, wherein one portion of the recess extends transversely the slots; and
   a core accommodated in the recess of the forming parts;
   wherein each of the forming parts further defines a chamber adjacent the slots, and the chamber is in communication with ends of the recess; and
   wherein the core comprises a generally U-shaped main body and a peripheral portion integrally adjoining ends of the main body, the main body is accommodated in the recesses of the forming parts, and the peripheral portion is accommodated in the chambers of the forming parts.

17. The apparatus as claimed in claim 16, wherein each of the forming parts further defines a sprue and a conduit connecting between the sprue and the cavity, the sprue being for feeding molten material into the mold, the conduit being for conveying molten material from the sprue to the cavity.

18. The apparatus as claimed in claim 17, wherein each of the forming parts further defines a well above and in communication with the slots, for air venting when the mold is filled with molten material and for providing surplus molten material needed when molten material in the slots solidifies and shrinks during a molding process.

19. The apparatus as claimed in claim 16, wherein the base part defines a pair of grooves in a top face thereof, and each of the forming parts comprises a pair of slide blocks slidably engaged in the grooves.

20. The apparatus as claimed in claim 16, wherein the core is made of water-soulable material.

* * * * *